(12) United States Patent
Song et al.

(10) Patent No.: US 8,557,398 B2
(45) Date of Patent: Oct. 15, 2013

(54) ORGANIC LIGHT EMITTING DEVICE

(75) Inventors: Won-Jun Song, Suwon-si (KR);
Yeun-Joo Sung, Suwon-si (KR);
Mu-Hyun Kim, Suwon-si (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 229 days.

(21) Appl. No.: 12/133,843

(22) Filed: Jun. 5, 2008

(65) Prior Publication Data

US 2009/0160319 A1    Jun. 25, 2009

(30) Foreign Application Priority Data

Dec. 24, 2007  (KR) .................. 10-2007-0136406

(51) Int. Cl.
*H05B 33/00* (2006.01)
(52) U.S. Cl.
USPC .................. 428/690; 428/411.1; 313/504
(58) Field of Classification Search
USPC ........................................... 428/690
See application file for complete search history.

(56) References Cited

U.S. PATENT DOCUMENTS

| | | | |
|---|---|---|---|
| 6,013,384 A | 1/2000 | Kido et al. | |
| 6,396,209 B1 * | 5/2002 | Kido et al. | 313/504 |
| 7,195,829 B2 | 3/2007 | Cosimbescu et al. | |
| 7,297,417 B2 | 11/2007 | Kim et al. | |
| 7,750,560 B2 | 7/2010 | Yamazaki et al. | |
| 2002/0024293 A1 | 2/2002 | Igarashi et al. | |
| 2004/0178720 A1 | 9/2004 | Lee et al. | |
| 2004/0207318 A1 | 10/2004 | Lee et al. | |
| 2005/0062406 A1 | 3/2005 | Kinoshita | |
| 2005/0221119 A1 | 10/2005 | Cosimbescu et al. | |

(Continued)

FOREIGN PATENT DOCUMENTS

| | | |
|---|---|---|
| CN | 1261760 A | 8/2000 |
| CN | 1781340 A | 5/2006 |

(Continued)

OTHER PUBLICATIONS

Japanese Office Action dated Mar. 2, 2010, issued in Japanese Patent Application No. 2008-249204.

(Continued)

*Primary Examiner* — Gerard Higgins
*Assistant Examiner* — J. L. Wang
(74) *Attorney, Agent, or Firm* — Robert E. Bushnell, Esq.

(57) ABSTRACT

An organic light emitting device includes a first electrode; a second electrode; an emissive layer disposed between the first electrode and the second electrode; a hole injection layer disposed between the first electrode and the emissive layer; and an electron transport layer disposed between the emissive layer and the second electrode. The hole injection layer includes a hole injecting material and a first compound made up of an element selected from the group consisting of Mo, Li, Na, K, Rb, Cs, Be, Mg, Ca, Sr, Ba, and B and an element selected from the group consisting of O, F, S, Cl, Se, Br, and I. The electron transport layer includes an electron transporting material and a second compound, wherein the second compound is represented by Formula 1:

$$X_a Y_b \qquad \text{<Formula 1>}$$

X is an alkali metal, an alkali earth metal, or a transition metal,
Y is a group 7 element, or a $C_1$-$C_{20}$ organic group,
a is a number in the range of 1 to 3, and
b is a number in the range of 1 to 3.

15 Claims, 6 Drawing Sheets

(56) References Cited

U.S. PATENT DOCUMENTS

| | | | |
|---|---|---|---|
| 2006/0008670 A1* | 1/2006 | Lin et al. | 428/690 |
| 2006/0008740 A1 | 1/2006 | Kido et al. | |
| 2006/0214553 A1 | 9/2006 | Nagara et al. | |
| 2006/0279190 A1 | 12/2006 | Nakayama | |
| 2006/0286405 A1 | 12/2006 | Begley et al. | |
| 2006/0292394 A1 | 12/2006 | Iwaki et al. | |
| 2007/0020483 A1 | 1/2007 | Park et al. | |
| 2007/0075637 A1 | 4/2007 | Kim et al. | |
| 2007/0090756 A1 | 4/2007 | Okada et al. | |
| 2007/0126348 A1 | 6/2007 | Iou | |
| 2007/0150206 A1 | 6/2007 | Iwaki et al. | |
| 2007/0170843 A1 | 7/2007 | Kawamura et al. | |
| 2007/0181876 A1* | 8/2007 | Itai | 257/40 |
| 2007/0210303 A1 | 9/2007 | Ikeda et al. | |
| 2007/0222376 A1 | 9/2007 | Ohsawa et al. | |
| 2008/0252199 A1 | 10/2008 | Yamazaki et al. | |
| 2009/0128024 A1 | 5/2009 | Fukuoka et al. | |
| 2009/0218934 A1 | 9/2009 | Song et al. | |

FOREIGN PATENT DOCUMENTS

| | | |
|---|---|---|
| CN | 101036246 A | 9/2007 |
| EP | 1 603 174 | 12/2005 |
| EP | 1 617 493 | 1/2006 |
| EP | 1 631 125 | 3/2006 |
| EP | 1 748 504 | 1/2007 |
| EP | 1 748 505 | 1/2007 |
| JP | 10270172 A | 10/1998 |
| JP | 2000-182774 | 6/2000 |
| JP | 2000-215984 | 8/2000 |
| JP | 2003-264083 | 9/2003 |
| JP | 2004-172149 | 6/2004 |
| JP | 2004-296403 | 10/2004 |
| JP | 2004-319424 | 11/2004 |
| JP | 2004-355975 | 12/2004 |
| JP | 2006-24791 | 1/2006 |
| JP | 2006-114521 | 4/2006 |
| JP | 2006-128097 | 5/2006 |
| JP | 2006-156344 | 6/2006 |
| JP | 2006-269819 | 10/2006 |
| JP | 2007-5784 | 1/2007 |
| JP | 2007-36175 | 2/2007 |
| JP | 2007-134677 | 5/2007 |
| JP | 2007-208217 | 8/2007 |
| JP | 2007-287676 | 11/2007 |
| JP | 2007-531316 | 11/2007 |
| KR | 1999-0031395 | 5/1999 |
| KR | 10-0263754 | 5/2000 |
| KR | 2005-15902 | 2/2005 |
| KR | 10-2005-0115472 | 12/2005 |
| KR | 2006-7899 | 1/2006 |
| KR | 2006-42177 | 5/2006 |
| KR | 10-2006-0133521 | 12/2006 |
| KR | 10-2006-0135801 | 12/2006 |
| KR | 10-0672535 | 1/2007 |
| KR | 2007-0013002 | 1/2007 |
| KR | 10-0698300 | 3/2007 |
| KR | 2007-71978 | 7/2007 |
| KR | 2007-0077617 | 7/2007 |
| KR | 2007-0117200 | 12/2007 |
| WO | WO 2004/028217 | 4/2004 |
| WO | WO 2006/109878 | 10/2006 |
| WO | 2006115232 | 11/2006 |
| WO | WO 2007/123061 | 11/2007 |

OTHER PUBLICATIONS

Walzer, K. et al. "Highly Efficient Organic Devices Based on Electrically Doped Transport Layers." *Chemical Reviews, American Chemical Society*. vol. 107. pp. 1233-1271. Jan. 1, 2007.
Communication issued by the European Patent Office on Apr. 29, 2009.
U.S. Appl. No. 12/133,802, filed Jun. 5, 2008, Song, Won-jun, Samsung SDI Co., Ltd.
U.S. Appl. No. 12/133,744, filed Jun. 5, 2008, Song, Won-jun, Samsung SDI Co., Ltd.
U.S. Appl. No. 12/133,824, filed Jun. 5, 2008, Song, Won-jun, Samsung SDI Co., Ltd.
U.S. Appl. No. 12/211,233, filed Sep. 16, 2008, Song, Won-jun, Samsung SDI Co., Ltd.
U.S. Appl. No. 12/211,224, filed Sep. 16, 2008, Song, Won-jun, Samsung SDI Co., Ltd.
Registration Determination Certificate issued Sep. 29, 2009, for corresponding Korean Patent Application No. 2009-040241095.
Registration Determination Certificate issued Sep. 30, 2009, for corresponding Korean Patent Application No. 2009-040783883.
Office Action issued in related U.S. Appl. No. 12/133,802 on Apr. 5, 2010.
Office Action issued in related U.S. Appl. No. 12/133,824 on Jul. 9, 2010.
Office Action issued in related U.S. Appl. No. 12/133,744 on Jul. 15, 2010.
US Office Action dated Aug. 19, 2010, issued in co-pending U.S. Appl. No. 12/133,712.
Japanese Office Action dated Sep. 28, 2010, issued in corresponding Japanese Application No. 2008-270210.
Japanese Office Action dated Sep. 28, 2010, issued in corresponding Japanese Application No. 2008-276076.
U.S. Appl. No. 12/133,712, filed Jun. 5, 2008, Won-Jun Song et al., Samsung Mobile Display Co., Ltd.
Extended European Search Report dated Feb. 11, 2009, issued in corresponding European Patent Application No. 08253275.5.
Korean Office Action dated Apr. 24, 2009, issued in corresponding Korean Patent Application No. 10-2007-0116759.
Japanese Office Action dated Sep. 7, 2010, issued in corresponding Japanese Application No. 2007-278415.
Japanese Office Action issued by Japanese Patent Office on Jun. 14, 2011, corresponding to Japanese Patent Application No. 2008-271210 and Request for Entry of the Accompanying Office Action attached herewith.
Chinese Office Action issued by Chinese Patent Office on Aug. 24, 2011, corresponding to Chinese Patent Application No. 200810184444.X and Request for Entry attached herewith.
Chinese Office Action issued by CPO on Jun. 12, 2012 in connection with Chinese Patent Application No. 200810184444.X, which claims Korean Patent Application No. 10-2007-0136406 as its priority document and Request for Entry of the Accompanying Office Action attached herewith.
Office Action issued in corresponding Korean Patent Application No. 2008-6472618 dated Dec. 29, 2008.
Extended European Search Report issued by the European Patent Office on Jan. 28, 2009.
Korean Registration Determination Certificate issued by the Korean Intellectual Property Office on Mar. 13, 2009.
Registration Determination Certificate issued by the Korean Intellectual Property Office on Apr. 28, 2009.
Registration Determination Certificate in corresponding Korean Patent Application No. 10-2007-0136406 dated Aug. 19, 2009.

* cited by examiner

FIG. 1A

| SECOND ELECTRODE |
| ELECTRON TRANSPORT LAYER |
| EMISSIVE LAYER |
| HOLE INJECTION LAYER |
| FIRST ELECTRODE |
| SUBSTRATE |

FIG. 1B

| SECOND ELECTRODE |
| ELECTRON INJECTION LAYER |
| ELECTRON TRANSPORT LAYER |
| EMISSIVE LAYER |
| HOLE TRANSPORT LAYER |
| HOLE INJECTION LAYER |
| FIRST ELECTRODE |
| SUBSTRATE |

FIG. 1C

| SECOND ELECTRODE |
| --- |
| ELECTRON INJECTION LAYER |
| ELECTRON TRANSPORT LAYER |
| HOLE BLOCKING LAYER |
| EMISSIVE LAYER |
| HOLE TRANSPORT LAYER |
| HOLE INJECTION LAYER |
| FIRST ELECTRODE |
| SUBSTRATE |

FIG. 1D

| SECOND ELECTRODE |
| --- |
| ELECTRON TRANSPORT LAYER |
| EMISSIVE LAYER |
| HOLE TRANSPORT LAYER |
| SECOND HOLE INJECTION LAYER |
| FIRST HOLE INJECTION LAYER |
| FIRST ELECTRODE |
| SUBSTRATE |

FIG. 1E

| SECOND ELECTRODE |
| --- |
| SECOND ELECTRON TRANSPORT LAYER |
| FIRST ELECTRON TRANSPORT LAYER |
| EMISSIVE LAYER |
| HOLE TRANSPORT LAYER |
| HOLE INJECTION LAYER |
| FIRST ELECTRODE |
| SUBSTRATE |

FIG. 1F

| SECOND ELECTRODE |
| --- |
| SECOND ELECTRON TRANSPORT LAYER |
| FIRST ELECTRON TRANSPORT LAYER |
| EMISSIVE LAYER |
| HOLE TRANSPORT LAYER |
| SECOND HOLE INJECTION LAYER |
| FIRST HOLE INJECTION LAYER |
| FIRST ELECTRODE |
| SUBSTRATE |

ORGANIC LIGHT EMITTING DEVICE

CROSS-REFERENCE TO RELATED APPLICATIONS

This application claims the benefit of Korean Patent Application No. 2007-136406, filed Dec. 24, 2007, in the Korean Intellectual Property Office, the disclosure of which is incorporated herein by reference.

BACKGROUND OF THE INVENTION

1. Field of the Invention

Aspects of the present invention relate to an organic light emitting device, and more particularly, to an organic light emitting device with improved driving voltage, light emitting efficiency, lifetime, and the like by using a novel hole injecting material and a novel electron transporting material. In addition, aspects of the present invention may contribute to development of a high image quailty organic light emitting device, and provides an organic light emitting device with reduced power consumption and improved lifetime.

2. Description of the Related Art

Organic light emitting devices are devices in which, when a current is supplied to an organic layer interposed between two electrodes, electrons and holes combine in the organic layer to emit light. Such organic light emitting devices can be formed as light-weight and thin information display devices having a high image quality, quick response time, and wide viewing angles. These features have led to rapid development of organic light emitting display device technology. Currently, organic light emitting devices are widely used in mobile phones and other information display devices.

Due to such rapid development of organic light emitting devices, competition with other information display devices such as TFT-LCDs is inevitable in terms of academic and industrial technology. In addition, conventional organic light emitting devices are limited in terms of the amount of efficiency and lifetime improvements and power consumption reduction that is possible. The need to improve efficiency and reduce power consumption is an important factor interfering with quantitative and qualitative growth of organic light emitting devices, and it is desirable that this issue be resolved.

SUMMARY OF THE INVENTION

Aspects of the present invention provide an organic light emitting device having reduced power consumption, improved driving voltage, light emitting efficiency and lifetime by introducing a novel hole injecting material and a novel electron transporting material.

According to an aspect of the present invention, there is provided an organic light emitting device comprising: a first electrode; a second electrode; an emissive layer disposed between the first electrode and the second electrode; a first hole injection layer disposed between the first electrode and the emissive layer; and a first electron transport layer disposed between the emissive layer and the second electrode, wherein the first hole injection layer comprises a hole injecting material and a first compound comprising an element selected from the group consisting of Mo, Li, Na, K, Rb, Cs, Be, Mg, Ca, Sr, Ba, ytterbium and B and an element selected from the group consisting of O, F, S, Cl, Se, Br, and I, and the first electron transport layer comprises an electron transporting material and a second compound, which is represented by Formula 1 below:

$$X_a Y_b \qquad \text{<Formula 1>}$$

wherein:

X is an alkali metal, an alkali earth metal, or a transition metal,

Y is a group 7 element, or a $C_1$-$C_{20}$ organic group, a is a number in the range of 1 to 3, and b is a number in the range of 1 to 3.

According to an aspect of the present invention, the organic light emitting device may further comprise a second hole injection layer in addition to the first hole injection layer.

According to an aspect of the present invention, the organic light emitting device may further comprise a second electron transport layer in addition to the first electron transport layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1A through 1F are schematic cross-sectional views illustrating structures of organic light emitting devices according to embodiments of the present invention;

DETAILED DESCRIPTION OF THE EMBODIMENTS

Figure 2:
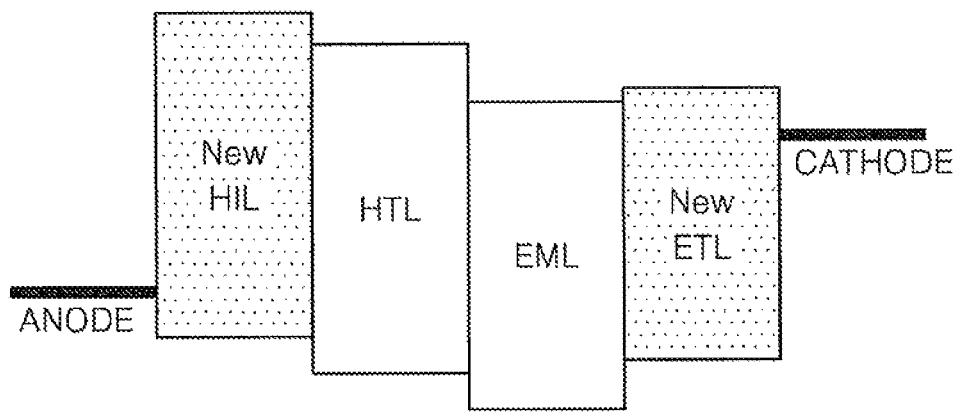
FIG. 2 is an energy band diagram schematically illustrating differences in HOMO and LUMO levels of layers of the organic light emitting device of FIG. 1A.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

To realize an organic light emitting device with high efficiency performance, the charge balance in an emissive layer is very important. Accordingly, aspects of the present invention provide a hole injection layer including a hole injecting material and a first compound comprising an element selected from the group consisting of Mo, Li, Na, K, Rb, Cs, Be, Mg, Ca, Sr, Ba, B, and ytterbium and an element selected from the group consisting of O, F, S, Cl, Se, Br, and I. In addition, aspects of the present invention provide an electron transport layer including a second compound, which is a metallic compound represented by Formula 1 below, and an electron transporting material.

$$X_a Y_b \qquad \text{<Formula 1>}$$

wherein:

X is an alkali metal, an alkali earth metal, or a transition metal,

Y is a group 7 element, or a $C_1$-$C_{20}$ organic group, a is a number in the range of 1 to 3, and b is a number in the range of 1 to 3.

The organic light emitting device according to an embodiment of the present invention includes a hole injection layer comprising a mixture of the first compound and a hole injecting material.

As non-limiting examples, the first compound may be a molybdenum oxide, a magnesium fluoride, a cesium fluoride, a boron oxide, a lithium oxide, an ytterbium oxide, or the like. The first compound may be prepared using various methods that are known to one of ordinary skill in the art.

The hole injecting material can be any known organic hole injecting material such as, for example, copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl) triphenylamine (TCTA), 4,4',4"-tris(3-methylphenylamino) triphenylamine (m-MTDATA), 1,3,5-tri(2-carbazolylphenyl) benzene, 1,3,5-tris(2-carbazolyl-5-methoxyphenyl)benzene, bis(4-carbazolylphenyl)silane, N,N'-bis(3-methylphenyl)-N, N'-diphenyl-[1,1-biphenyl]-4,4'diamine (TPD), N,N'-di (naphthalene-1-yl)-N,N'-diphenylbenzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl) diphenylamine) (TFB), poly(9,9-dioctylfluorene-co-bis-N, N-phenyl-1,4-phenylenediamine (PFB), or the like.

As a non-limiting example, the mixing ratio of the first compound to the hole injecting material may be in the range of 1:1 to 3:1. When the mixing ratio of the first compound to the hole injecting material is less than 1:1, that is, when an amount of the first compound is relatively lower and an amount of the hole injecting material is high, an injection voltage is increased. On the other hand, when the mixing ratio of the first compound to the hole transporting material is greater than 3:1, that is, when an amount of the first compound is relatively much higher and an amount of the hole injecting material is low, the hole injection layer may have insulating properties.

Conventionally, organic-based materials have been used by themselves for reducing the hole injection barrier. However, when these materials are used, an energy gap may still exist between electrodes and the organic-based material. When the first compound according to aspects of the present invention is used on an interface of an electrode, the metallic properties of an element selected from the group consisting of Mo, Li, Na, K, Rb, Cs, Be, Mg, Ca, Sr, Ba, and B can be utilized such that the contact resistance at the electrode interface is decreased, and thus, interface properties of electrodes using a semiconducting compound, ohmic contact, can be obtained.

An organic light emitting device having such structures described above, according to aspects of the present invention, can reduce the hole injection barrier, and also can reduce the contact resistance at the interface of the electrode, and thus, when the organic light emitting device operates, the organic light emitting device can have a longer lifetime.

An organic light emitting device according to an embodiment of the present invention may further include a second hole injection layer.

The second hole injection layer may be formed of a conventional organic hole injecting material without including the first compound. For example, the second hole injection layer may comprise at least hole injecting material selected from the group consisting of copper phthalocyanine, 1,3,5-tricarbazolyl benzene, 4,4'-biscarbazolylbi phenyl, polyvinylcarbazole, m-biscarbazolylphenyl, 4,4'-biscarbazolyl-2, 2'-dimethylbiphenyl, 4,4',4"-tri(N-carbazolyl) triphenylamine (TCTA), 4,4',4"-tris(3-methylphenylamino) triphenylamine (m-MTDATA), 1,3,5-tri(2-carbazolylphenyl) benzene, 1,3,5-tris(2-carbazolyl-5-methoxyphenyl)benzene, bis(4-carbazolylphenyl)silane, N,N'-bis(3-methylphenyl)-N, N'-diphenyl-[1,1-biphenyl]-4,4'diamine (TPD), N,N'-di (naphthalene-1-yl)-N,N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl) diphenylamine) (TFB), poly(9,9-dioctylfluorene-co-bis-N, N-phenyl-1,4-phenylenediamine (PFB), and the like.

As described above, when the organic light emitting device according to aspects of the present invention includes a hole injection layer having a two-layered structure, that is, a first hole injection layer and a second hole injection layer, the effects described above are more obviously realized. When the organic light emitting device includes the second hole injection layer, barriers when holes are transferred to a hole transport layer from the first hole injection layer can be reduced.

The thickness ratio of the first hole injection layer to the second hole injection layer may be in the range of 1:99 to 1:9. When the thickness ratio of the first hole injection layer to the second hole injection layer is less than 1:99, that is, when the thickness of the first hole injection layer is much thinner with respect to the second hole injection layer, the effect of a reduction in hole injection barrier is reduced. On the other hand, when the thickness ratio of the first hole injection layer to the second hole injection layer is greater than 1:9, that is, when the thickness of the first hole injection layer is not much thinner with respect to the second hole injection layer, hole transporting ability to an electric field is reduced.

The organic light emitting device according to the embodiment described above further includes a first electron transport layer that comprises a first electron transporting material and a second compound, which is a metallic compound represented by Formula 1, above. In Formula 1, as a non-limiting example, X may be Li, Cs, Na, Ba, or Mg, and Y may be fluoride, quinolate, acetoacetate, chloride, or bromide. When the electron transport layer comprises a halide element, the properties of electron injection from an electrode vary depending on the strength of electronegativity of the halide. Specifically, the second compound may be a metal halide containing a halogen atom, such as lithium fluoride, a metal complex material such as lithium quinolate, lithium acetoacetate, and the like, or mixtures thereof. As specific non-limiting examples, the compound may comprise at least one selected from the group consisting of lithium quinolate, sodium quinolate, lithium acetoacetate, magnesium acetoacetate, lithium fluoride, cesium fluoride, sodium fluoride, and lithium oxide. The first electron transporting material may comprise an electron transporting material having an electron mobility of $10^{-8}$ cm$^2$/V·s or more in an electric field of 800 to 1000 V/cm. As non-limiting examples, the first electron transporting material of the first electron transport layer may be Alq$_3$, Bebq$_2$, Znq, or the like.

As a non-limiting example, the amount of the second compound, (the metallic compound of Formula 1) may be in the range of 30 to 50 parts by weight based on 100 parts by weight of the first electron transporting material.

In the organic light emitting device according to aspects of the present invention, an electron injection layer may be omitted without lowering the ability of electron injection in OLEDs.

In addition, the organic light emitting device may further include a second electron transport layer in addition to the first electron transport layer described above. The second electron transport layer may comprise a second electron transporting material, which may be the same as or different from the first electron transporting material. In more detail, the organic light emitting device according to aspects of the present invention may include a first electron transport layer comprising the second compound (the metallic compound of Formula 1) and a first electron transporting material, and a second electron transport layer comprising a second electron transporting material and not containing the second compound. The second electron transporting material may have be the same as the first electron transporting material in terms of electron injection barriers and electron mobility. In particular, the second electron transporting material may have an electron mobility of $10^{-8}$ cm$^2$/V·s or more in an electric field of 800 to 1000 V/cm, or more specifically, $10^{-4}$ to $10^{-8}$ cm$^2$/V·s, in an electric field of 800 to 1000 V/cm, and may be Alq$_3$, Bebq$_2$, Znq, or the like.

When the organic light emitting device includes the two-layered electron transport layer as described above, a much more systematic electron injection is possible compared with the case where an organic light emitting device includes a single-layered electron transport layer. Thus, power consumption may be significantly reduced due to voltage reduction.

A separate electron injection layer may be omitted from the organic light emitting device described herein.

The organic light emitting device according to aspects of the present invention may have a variety of structures. FIGS. 1A through 1F are schematic cross-sectional views illustrating structures of organic light emitting devices according to embodiments of the present invention.

The organic light emitting device may have a structure of an anode, a hole injection layer (HIL), a hole transport layer (HTL), an emissive layer (EML), an electron transport layer (ETL), an electron injection layer (EIL), and a cathode. As specific, non-limiting examples, the organic light emitting device may have one of the following structures:

first electrode/hole injection layer/emissive layer/electron transport layer/second electrode (FIG. 1A);

first electrode/hole injection layer/bole transport layer/emissive layer/electron transport layer/electron injection layer/second electrode (FIG. 1B);

first electrode/hole injection layer/hole transport layer/emissive layer/hole blocking layer/electron transport layer/electron injection layer/second electrode (FIG. 1C);

first electrode/first hole injection layer/second hole injection layer/hole transport layer/emissive layer/electron transport layer/second electrode (FIG. 1D)

first electrode/hole injection layer/hole transport layer/emissive layer/first electron transport layer/second electron transport layer/second electrode (FIG. 1E); and first electrode/first hole injection layer/second hole injection layer/hole transport layer/emissive layer/first electron transport layer/second electron transport layer/second electrode (FIG. 1F).

The organic light emitting device further include additional layers, such as one-layered or two-layered intermediate layers, if desired, and may have other structures or layers in addition to the layers shown in FIGS. 1A-1F.

Hereinafter, a method of manufacturing an organic light emitting device according to an embodiment of the present invention will be described.

First, a material for a first electrode material is coated onto a substrate to form a first electrode (typically, an anode). Herein, the substrate may comprise a substrate material typically used in conventional organic light emitting devices. For example, the substrate may be a glass substrate or a plastic substrate having good transparency, surface smoothness, manageability and waterproofness. The material for the anode can be a transparent and highly conductive material, such as ITO, IZO, SnO$_2$, ZnO, or the like.

Next, a hole injection layer (HIL) is formed on the first electrode using various methods such as vacuum deposition, spin coating, casting, Langmuir Blodgett (LB) deposition, or the like.

When the HIL is formed by vacuum deposition, vacuum deposition conditions may vary according to the compound used to form the HIL, and the desired structure and thermal properties of the HIL to be formed. In general, however, the vacuum deposition may be performed at a deposition temperature of 50-500° C., a pressure of $10^{-8}$-$10^{-3}$ torr, and a deposition speed of 0.01-100 Å/sec. The thickness of the HIL may be in the range of 10 Å to 5 μm.

Next, a hole transport layer (HTL) is formed on the HIL using a hole transporting material. The HTL may be formed by vacuum deposition, spin coating, casting, LB deposition, or the like; for example, the HTL may be formed on the HIL by vacuum deposition such that a uniform film may be easily formed and so that pin holes are not easily formed. When the HTL is formed by vacuum deposition, the deposition conditions may vary according to the compound used to form the HTL. In general, however, the deposition conditions may be similar to those used for the formation of the HIL.

The hole transporting material is not particularly limited, and may be N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like.

Next, an emissive layer (EML) is formed on the HTL. The EML can be formed by vacuum deposition, spin coating, casting, LB deposition, or the like.

The material for forming the EML is not particularly limited. As non-limiting examples, the material for forming the EML may be a blue emitting material such as oxadiazole dimer dyes (Bis-DAPOXP)), spiro compounds (Spiro-DPVBi, Spiro-6P), triarylamine compounds, bis(styryl) amine (DPVBi, DSA), 4,4'-bis(9-ethyl-3-carbazovinylene)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl]stylbene (DPAVB), 4,4'-bis[4-(diphenylamino)styryl]biphenyl (BDAVBi), bis(3,5-difluoro-2-(2-pyridyl)phenyl-(2-carboxypyridyl)iridium III (FIrPic), or the like; a green emitting material such as 3-(2-benzothiazolyl)-7-(diethylamino)coumarin (Coumarin 6), 2,3,6,7-tetrahydro-1,1,7,7,-tetramethyl-1H,5H,11H-10-(2-benzothiazolyl)quinolizino-[9,9a,1gh]coumarin (C545T), N,N'-dimethyl-quinacridone (DMQA), tris(2-phenylpyridine)iridium (III) (Ir(ppy)$_3$), or the like; or a red emitting material such as tetraphenylnaphthacene (Rubrene), tris(1-phenylisoquinoline)iridium (III) (Ir(piq)$_3$), bis(2-benzo[b]thiophene-2-yl-pyridine) (acetylacetonate)iridium (III) (Ir(btp)$_2$(acac)), tris(dibenzoylmethane)phenanthroline europium (III) (Eu(dbm)$_3$(phen)), tris[4,4'-di-tert-butyl-(2,2')-bipyridine]ruthenium (III) complex (Ru(dtb-bpy)$_3$*2 (PF$_6$)), DCM1, DCM2, Eu (thenoyltrifluoroacetone)$_3$ (Eu(TTA)$_3$), butyl-6-(1,1,7,7-tetramethyljulolidyl-9-enyl)-4H-pyran (DCJTB), or the like. In addition, the material for forming the EML may include as a polymer emitting material an aromatic compound comprising nitrogen and polymers such as phenylenes, phenylene vinylenes, thiophenes, fluorenes, spiro-fluorenes, or the like; however, the present invention is not limited thereto.

The thickness of the EML may be in the range of 10 to 500 nm, or more specifically, in the range of 50 to 120 nm. In particular, as a specific, non-limiting example, the thickness of the EML when formed of a blue emitting material may be 70 nm. When the thickness of the EML is less than 10 nm, the leakage current increases so that the efficiency of the organic ight emitting device decreases. On the other hand, when the thickness of the EML is greater than 500 nm, the driving voltage is increased.

If desired, the EML can be prepared by adding an emissive dopant to a host for the EML. As non-limiting examples, the fluorescent host material may be tris(8-hydroxy-quinolinato) aluminum ($Alq_3$), 9,10-di(naphth-2-yl)anthracene (AND), 3-Tert-butyl-9,10-di(naphth-2-yl)anthracene (TBADN), 4,4'-bis(2,2-diphenyl-ethene-1-yl)-4,4'-biphenyl (DPVBi), 4,4'-bis(2,2-diphenyl-ethene-1-yl)-4,4'-dimethylphenyl (p-DMDPVBi), Tert(9,9-diarylfluorene)s (TDAF), 2-(9,9'-spirobifluorene-2-yl)-9,9'-spirobifluorene (BSDF), 2,7-bis (9,9'-spirobifluorene-2-yl)-9,9'-spirobifluorene (TSDF), bis (9,9-diarylfluorene)s (BDAF), 4,4'-bis(2,2-diphenyl-ethene-1-yl)-4,4'-di-(tert-butyl)phenyl (p-TDPVBi), or the like. As non-limiting examples, the phosphorescence host material may be 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-Bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like.

As specific, non-limiting examples, the dopant may be 4,4'-bis[4-(di-p-tolylamino)styryl]biphenyl (DPAVBi), and a fluorescence host may be 9,10-di(naphth-2-yl)anthracene (ADN) or 3-tert-butyl-9,10-di(naphth-2-yl)anthracene (TBADN).

The amount of the dopant varies according to the particular material that forms the EML. In general, however, the amount of the dopant may be in the range of 3-80 parts by weight based on 100 parts by weight of the material that forms the EML (total weight of host and dopant). If the amount of the dopant is outside this range, light emitting properties of the organic light emitting device may be degraded.

Next, an electron transport layer (ETL) is formed on the EML using an electron transporting material and the second compound (that is, the metallic compound of Formula 1). The ETL may be formed by vacuum deposition. The electron transporting material may be an electron transporting material having an electron mobility of $10^{-8}$ $cm^2/V \cdot s$ or more, preferably in the range of $10^{-3}$ to $10^{-8}$ $cm^2/V \cdot s$, in an electric field of 800 to 1000 V/cm. If the electron mobility of the electron transport layer is less than $10^{-8}$ $cm^2/V \cdot s$, electron injection to the EML may be excessive, resulting in poor charge balance.

As non-limiting examples, the electron transporting material may be bis(10-hydroxybenzo[h]quinolinato)beryllium ($Bebq_2$) represented by Formula 2 below, $Alq_3$, $Znq_2$, or the like.

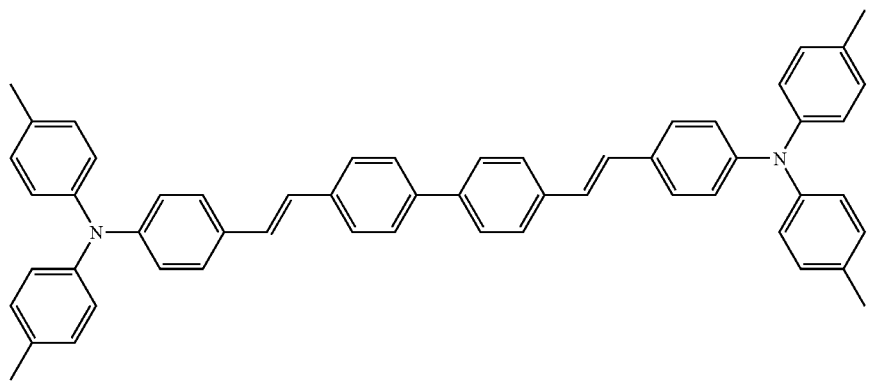

DPAVBI

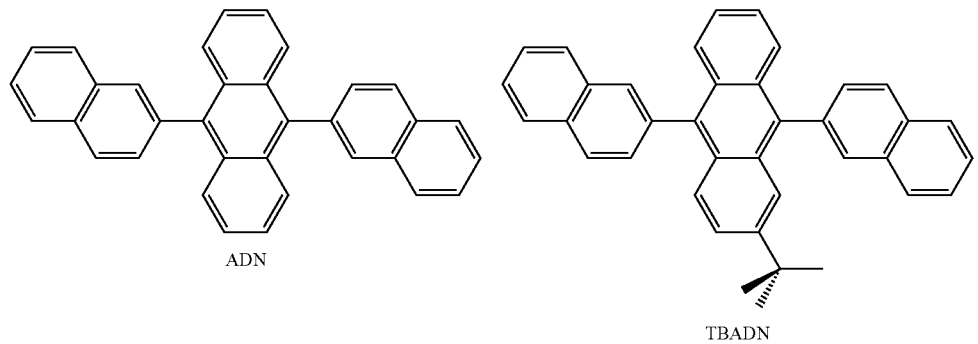

ADN

TBADN

<Formula 2>

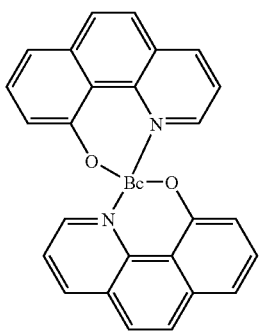

In addition, an electron injection layer may be omitted from the organic light emitting device according to aspects of the present invention and the organic light emitting device may still exhibit an excellent electron injection ability. However, when an electron injection layer (EIL) that facilitates electron injection from a cathode is formed on the ETL, the electron injection ability is significantly improved.

As non-limiting examples, the material for forming the EIL may be LiF, NaCl, CsF, $Li_2O$, BaO, or the like. The deposition conditions of the ETL and the EIL may vary according to the compounds used to form the ETL and the EIL. In general, however, the deposition conditions are similar to those used for the formation of the HIL.

Finally, a cathode, a second electrode, is formed on the EIL using a metal material. The cathode may be formed by vacuum deposition, sputtering, or the like. Herein, the metal material is selected to have a low work function and may be a metal, alloy, an electrically conductive compound, or a mixture thereof. As particular non-limiting examples, the metal used to form the cathode may be Li, Mg, Al, Al—Li, Ca, Mg—In, Mg—Ag, or the like, and the cathode may be formed of a transparent material such as ITO, or IZO in order to manufacture a top emission organic light emitting device.

A method of manufacturing an organic light emitting device according to another embodiment of the present invention will now be described. The method of manufacturing an organic light emitting device according to this embodiment is similar to that of the previous embodiment except that a first electron transport layer is formed on the EML by vacuum depositing a first electron transporting material and a second electron transport layer is formed on the first electron transport layer by vacuum depositing a second electron transporting material and second compound (the metallic compound of Formula 1).

FIG. 2 is an energy band diagram schematically illustrating differences of highest occupied molecular orbital (HOMO) and lowest unoccupied molecular orbital (LUMO) levels of layers of the organic light emitting device of FIG. 1A, including an anode, a hole injection layer as described herein, a hole transport layer, an emission layer, an electron transport layer as described herein, and a cathode.

Hereinafter, aspects of the present invention will be described in greater detail with reference to the following examples. The following examples are for illustrative purposes only and are not intended to limit the scope of the invention.

EXAMPLE 1

Manufacture of Organic Light Emitting Device

As an anode, a Corning 15 $\Omega/cm^2$ (1200 Å) ITO glass substrate was cut to a size of 50 mm×50 mm×0.7 mm and was ultrasonically washed with isopropyl alcohol and pure water for 5 minutes, respectively. The ITO glass substrate was irradiated with ultraviolet rays for 30 minutes and washed with ozone.

Then, NPB and MoOX were co-deposited on the substrate to form a first hole injection layer with a thickness of 100 Å. Subsequently, TCTA was coated on the first hole injection layer to form a second hole injection layer.

NPB was vacuum deposited on the second hole injection layer to form a hole transport layer having a thickness of 60 nm. After the formation of the hole transport layer, 100 parts by weight of $Alq_3$ as a host and 5 parts by weight of coumarin 6 as a dopant were vacuum deposited on the hole transport layer to form an emissive layer.

Then, 30 parts by weight of LiF and 70 parts by weight of $BeBq_2$ were vacuum co-deposited on the emissive layer to form an electron transport layer (ETL) having a thickness of 35 nm.

Al was vacuum deposited on the ETL to form a cathode having a thickness of 3000 Å. Thus, the manufacture of an organic light emitting device was completed.

EXAMPLE 2

Manufacture of Organic Light Emitting Device

An organic light emitting device was manufactured in the same manner as in Example 1, except that 50 parts by weight of lithium quinolate and 50 parts by weight of $BeBq_2$ were vacuum co-deposited to form the electron transport layer.

EXAMPLE 3

Manufacture of Organic Light Emitting Device

As an anode, a Corning 15 $\Omega/cm^2$ (1200 Å) ITO glass substrate was cut to a size of 50 mm×50 mm×0.7 mm and was ultrasonically washed with isopropyl alcohol and pure water for 5 minutes, respectively. The ITO glass substrate was irradiated with ultraviolet rays for 30 minutes and washed with ozone.

A hole injection layer formed of CuPc was formed on the substrate to a thickness of 5 nm.

NPB was vacuum deposited on the hole injection layer to form a hole transport layer having a thickness of 60 nm. After the formation of the hole transport layer, 100 parts by weight of $Alq_3$ as a host and 5 parts by weight of coumarin 6 as a dopant were vacuum deposited on the hole transport layer to form an emissive layer.

Then, $BeBq_2$ was vacuum deposited on the emissive layer to form a first electron transport layer (ETL1) having a thickness of 10 nm.

50 parts by weight of LiF and 50 parts by weight of $BeBq_2$ were vacuum co-deposited on the ETL1 to form a second electron transport layer (ETL2) having a thickness of 20 nm.

Al was vacuum deposited on the ETL2 to form a cathode having a thickness of 3000 Å, that is, an Al electrode. Thus, the manufacture of an organic light emitting device was completed.

EXAMPLE 4

Manufacture of Organic Light Emitting Device

An organic light emitting device was manufactured in the same manner as in Example 1, except that 50 parts by weight of cesium fluoride and 50 parts by weight of BeBq$_2$ were vacuum co-deposited to form the ETL2.

COMPARATIVE EXAMPLE 1

Manufacture of Organic Light Emitting Device

An organic light emitting device was manufactured in the same manner as in Example 1, except that a first compound was used in the formation of the electron transport layer.

Figure 3:
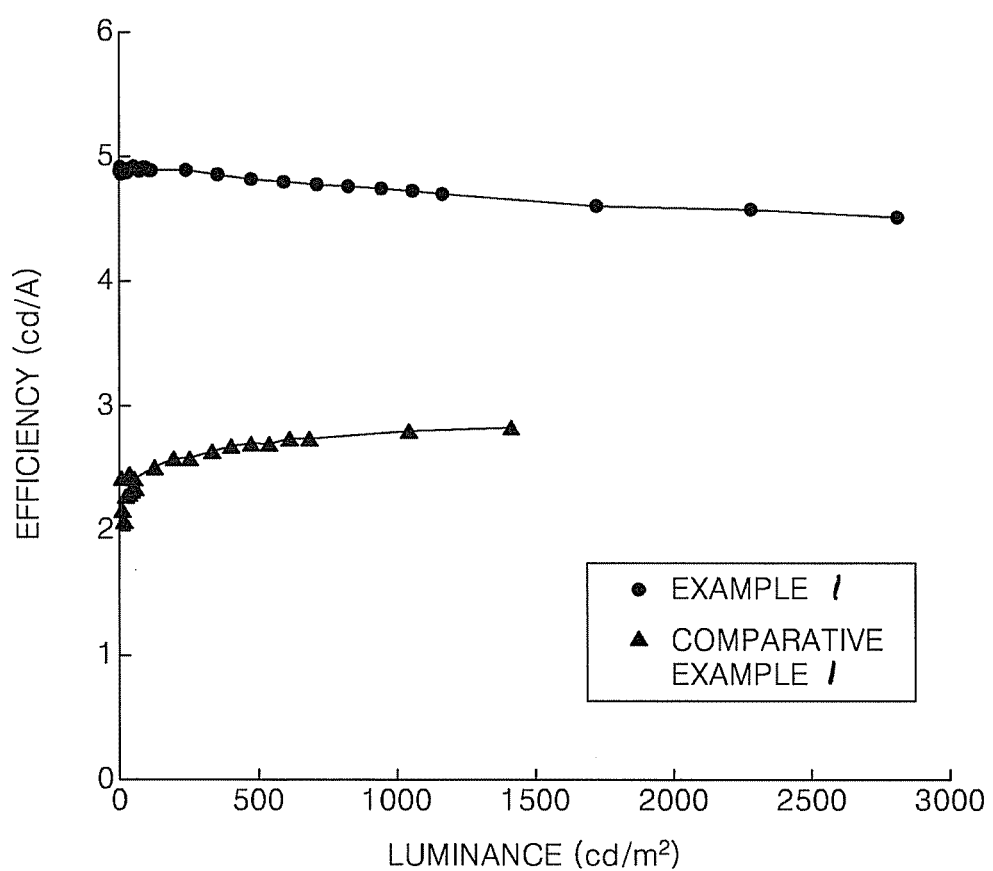
FIG. 3 is a graph showing efficiency properties of an organic light emitting device according to Example 1 and Comparative Example 1.
Figure 4:
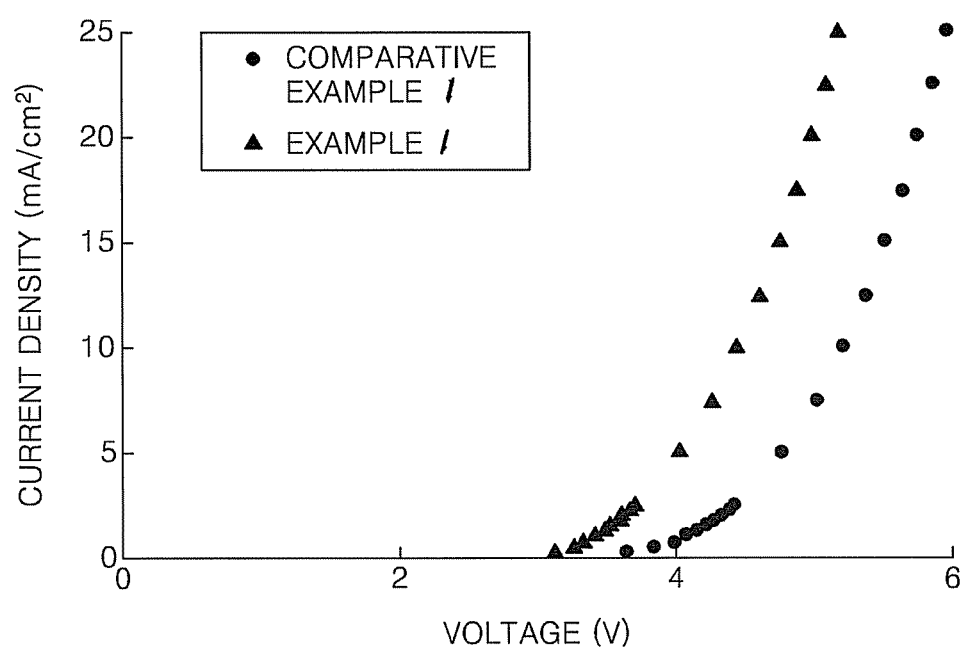
FIG. 4 is a graph showing current density with respect to voltage of an organic light emitting device according to Example 1 and a Comparative Example 1.

Power efficiency (cd/A) according to luminance (cd/m$^2$) and current density (mA/cm$^2$) according to voltage (V) of the organic light emitting devices manufactured in Example 1 and Comparative Example 1 were measured. The results are shown in the graphs of FIGS. 3 and 4. FIG. 3 shows that the organic light emitting device of Example 1 had a greater efficiency compared to the organic light emitting device Comparative Example 1. FIG. 4 shows that the organic light emitting device required less voltage to reach a given current density compared to the organic light emitting device of Comparative Example 1.

An organic light emitting device according to aspects of the present invention has excellent electrical properties, and uses a hole injecting material that is suitable for use in fluorescent and phosphorescent devices with any kind of colors, such as red, green, blue, white, or the like. In addition, the organic light emitting device according to aspects of the present invention uses an electron transporting material that provides an improved electron injection ability such that a separate electron injection layer is not necessary. Therefore, compared with the case where a conventional electron transporting material is used, the organic light emitting device according to aspects of the present invention using the electron transporting material described herein has improved current and power efficiencies, and has improved driving voltage and lifetime by adjusting the balance of charges injected into the emissive layer. Due to such configuration of the organic light emitting device according to aspects of the present invention, charge injection barriers can be reduced, resulting in reduction in power consumption, and the current efficiency can be maximized by adjusting a charge mobility of the hole injecting and electron transporting materials described herein. In addition, the organic light emitting device can have higher luminance and longer lifetime.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting device comprising:
a first electrode;
a second electrode;
an emissive layer disposed between the first electrode and the second electrode;
a first hole injection layer disposed between the first electrode and the emissive layer;
a second hole injection layer disposed between the first hole injection layer and the emissive layer, comprising a second hole injecting material; and
a first electron transport layer disposed between the emissive layer and the second electrode,
the first hole injection layer comprising a hole injecting material and a first compound comprising an element selected from the group consisting of Mo, Li, Na, K, Rb, Cs, Be, Mg, Ca, Sr, Ba, ytterbium and B and an element selected from the group consisting of O, F, S, Cl, Se, Br, and I,
the second hole injecting material being at least one selected from the group consisting of copper phthalocyanine, 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(Ncarbazolyl) triphenylamine (TCTA), 4,4',4"-tris(3-methylphenylamino)triphenylamine (m-MTDATA), 1,3,5-tri (2-carbazolylphenyl) benzene, 1,3,5-tris(2-carbazolyl-5 methoxyphenyl)benzene, bis(4-carbazolylphenyl)silane, N,N'-bis(3-methylphenyl)-N,N'diphenyl-[1, 1-biphenyl]-4,4'-diamine (TPD), N,N'-di(naphthalene-1-yl)-N,N'-diphenyl benzidine (α-NPD), N,N'-diphenyl-N,N'-bis(1-naphthyl)-(1, 1'-biphenyl)-4,4'-diamine (NPB), poly(9,9-dioctylfluorene-co-N-(4-butylphenyl)diphenylamine) (TFB), and poly(9,9-dioctylfluorene-co-bis-N, N-phenyl-1,4-phenylenediamine (PFB),
a thickness ratio of the first hole injection layer to the second hole injection layer being in a range of 1:99 to 1:9, and
the first electron transport layer comprising a first electron transporting material and a second compound, the second compound represented by Formula 1 below:

$$X_a Y_b \qquad \text{<Formula 1>}$$

wherein:
X is an alkali metal, an alkali earth metal, or a transition metal,
Y is a group 7 element, or acetoacetate,
a is a number in the range of 1 to 3, and
b is a number in the range of 1 to 3,
an amount of the second compound in the first electron transport layer being in a range of 30 to 50 parts by weight based on 100 parts by weight of the first electron transporting material.

2. The organic light emitting device of claim 1, wherein the hole injecting material is at least one selected from the group consisting of copper phthalocyanine, 1,3,5-tricarbazolylbenzene, 4,4'- biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine (TCTA), 4,4',4"-tris(3-methylphenylamino)triphenylamine (m-MTDATA), 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalene-1-yl)-N, N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB), and poly(9,9-dioctylfluorene-co-bis-N,N-phenyl-1, 4-phenylenediamine (PFB).

3. The organic light emitting device of claim 1, wherein a mixing ratio of the first compound to the hole injecting material is in a range of 1:1 to 3:1.

4. The organic light emitting device of claim 1, wherein the first compound is selected from the group consisting of a molybdenum oxide, a magnesium fluoride, a cesium fluoride, a boron oxide, a lithium oxide, and an ytterbium oxide.

5. The organic light emitting device of claim 1, wherein, in Formula 1, X is Li, Cs, Na, Ba, or Mg.

6. The organic light emitting device of claim 1, wherein, in Formula 1, Y is acetoacetate, fluoride, chloride, or bromide.

7. The organic light emitting device of claim 1, wherein the second compound comprises at least one selected from the group consisting of lithium acetoacetate, magnesium acetoacetate, lithium fluoride, cesium fluoride, and sodium fluoride.

8. The organic light emitting device of claim 1, wherein the first electron transporting material has an electron mobility of $10^{-8}$ cm$^2$/V·s or more in an electric field of 800 to 1000 V/cm.

9. The organic light emitting device of claim 1, wherein the first electron transporting material comprises at least one selected from the group consisting of bis(10-hydroxybenzo[h]quinolinato)beryllium (Bebq$_2$) represented by Formula 2 below, Alq$_3$, and Znq$_2$.

<Formula 2>

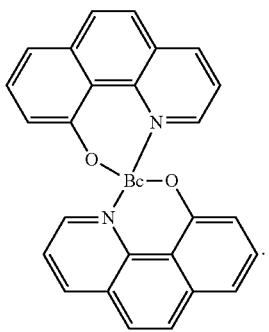

10. The organic light emitting device of claim 1, further comprising a second electron transport layer comprising a second electron transporting material.

11. The organic light emitting device of claim 10, wherein the second electron transporting material has an electron mobility of $10^{-8}$ cm$^2$/V·s or more in an electric field of 800 to 1000 V/cm.

12. The organic light emitting device of claim 10, wherein the second electron transporting material has an electron mobility of $10^{-8}$ to $10^{-4}$ cm$^2$/V·s in an electric field of 800 to 1000 V/cm.

13. The organic light emitting device of claim 10, wherein a thickness ratio of the first electron transport layer to the second electron transport layer is in a range of 1:1 to 2:1.

14. The organic light emitting device of claim 1, further comprising at least one layer selected from the group consisting of a hole transport layer, an electron blocking layer, a hole blocking layer, a second electron transport layer, and an electron injection layer.

15. The organic light emitting device of claim 1, having one of the following structures:
   first electrode/first hole injection layer/second hole injection layer/hole transport layer/emissive layer/electron transport layer/second electrode; and
   first electrode/first hole injection layer/second hole injection layer/hole transport layer/emissive layer/first electron transport layer/second electron transport layer/second electrode.

* * * * *